(12) United States Patent
Kantor et al.

(10) Patent No.: US 8,283,956 B2
(45) Date of Patent: Oct. 9, 2012

(54) RADIATION-HARDENED CHARGE PUMP TOPOLOGY

(75) Inventors: Bradley A. Kantor, Plymouth, MN (US); James D. Seefeldt, Eden Prairie, MN (US)

(73) Assignee: Honeywell International Inc., Morristown, NJ (US)

(*) Notice: Subject to any disclaimer, the term of this patent is extended or adjusted under 35 U.S.C. 154(b) by 124 days.

(21) Appl. No.: 12/416,679

(22) Filed: Apr. 1, 2009

(65) Prior Publication Data
US 2010/0253403 A1  Oct. 7, 2010

(51) Int. Cl.
*H03L 7/06* (2006.01)
(52) U.S. Cl. ........................ 327/157; 327/530
(58) Field of Classification Search .................. 327/157, 327/530, 534–536
See application file for complete search history.

(56) References Cited

U.S. PATENT DOCUMENTS

| | | | |
|---|---|---|---|
| 4,167,711 A | 9/1979 | Smoot | |
| 4,546,330 A | 10/1985 | Okada | |
| 5,939,912 A | 8/1999 | Rehm | |
| 5,950,115 A | 9/1999 | Momtaz et al. | |
| 7,279,909 B1 | 10/2007 | Abdelli | |
| 7,323,915 B2* | 1/2008 | Josephson | 327/149 |
| 7,795,927 B2* | 9/2010 | Farwell | 327/34 |
| 2005/0218998 A1 | 10/2005 | Lim | |
| 2007/0090887 A1 | 4/2007 | Seefeldt et al. | |
| 2007/0164800 A1 | 7/2007 | Josephson | |
| 2008/0061888 A1 | 3/2008 | Liu | |
| 2009/0140773 A1* | 6/2009 | Cheung | 327/3 |

FOREIGN PATENT DOCUMENTS
EP  1406389  7/2004
JP  57186838  11/1982

OTHER PUBLICATIONS

Pan, Dong, Harry Li, and Bogdan Wilamowski. "A Radiation-hard Phase-Locked Loop." <http://www.eng.auburn.edu/~wilambm/pap/2003/radiation%20hard%20ISIE03.pdf> (Printed Jun. 20, 2008).
Loveless, Thomas D. "A Radiation-Hardened-by-Design Charge Pump for Phase-Locked Loop Circuits." ETD-Electronic Theses & Dissertations. Vanderbilt University. <http://etd.library.vanderbilt.edu/available/etd-01292008-150433/> URN No: etd-01292008-150433. Date of Defense: Mar. 16, 2007. (Printed Jun. 20, 2008).
European Search Report from corresponding EP Application No. 10156001.9, mailed Jul. 9, 2010, 3 pages.
European Examination Report form corresponding EP Application No. 10156001.9, mailed Jul. 30, 2010, 5 pages.
Reply to communication from the Examining Division, for EP Application No. 10156001.9, dated Nov. 30, 2010, 19 pages.

* cited by examiner

*Primary Examiner* — Lincoln Donovan
*Assistant Examiner* — Diana J Cheng
(74) *Attorney, Agent, or Firm* — Shumaker & Sieffert, P.A.

(57) ABSTRACT

A radiation-hardened charge pump circuit is provided. The circuit includes a first charge pump having a first charge pump output, a second charge pump having a second charge pump output, a first coincidence detector receiving as inputs the first charge pump output and the second charge pump output and producing as an output a first coincidence signal, and an analog 2:1 multiplexor for selecting either the first charge pump output or the second charge pump output based on the first coincidence signal. In alternative embodiment, the circuit includes at least three charge pumps, at least two coincidence detectors, decision logic, and a correspondingly-sized analog multiplexor.

12 Claims, 5 Drawing Sheets

RADIATION-HARDENED CHARGE PUMP TOPOLOGY

FIELD

The present invention relates to radiation hardening, and more particularly, to a radiation-hardened charge pump topology.

BACKGROUND

Charge pumps are frequently used in phase locked loops (PLLs), delay locked loops (DLLs), voltage regulators, and other applications in order to provide a voltage level that is higher or lower than a source voltage. To do this, charge pumps typically incorporate one or more capacitors in combination with alternating current sources and a switching mechanism to add (or subtract) stored charges on the one or more capacitors, thus resulting in a customized output voltage related to the amount of capacitance and stored charge.

However, charge pumps are susceptible to radiation events such as Single Event Upsets (SEUs). These events can greatly disrupt the charge pump output and in turn, disrupt the systems in which the charge pumps reside. For example, FIG. 1 is a differential output voltage graph 10 illustrating a type of disturbance 12 that might be observed in a phase-locked loop when a charge pump experiences a radiation event. For applications such as spaced-based electronics and others requiring high reliability, a charge pump topology that is less susceptible to SEUs would be desirable.

SUMMARY

A radiation-hardened charge pump circuit is provided. The circuit includes a first charge pump having a first charge pump output, a second charge pump having a second charge pump output, a first coincidence detector receiving as inputs the first charge pump output and the second charge pump output and producing as an output a first coincidence signal, and an analog 2:1 multiplexor for selecting either the first charge pump output or the second charge pump output based on the first coincidence signal. In alternative embodiment, the circuit includes at least three charge pumps, at least two coincidence detectors, decision logic, and a correspondingly-sized analog multiplexor.

This charge pump topology is less susceptible to SEUs and could also be used to compensate for a failure in the phase frequency detector/charge pump circuit (discussed below) either initially or during the operational life of the circuit.

DETAILED DESCRIPTION OF PRESENTLY PREFERRED EMBODIMENTS

Figure 1:
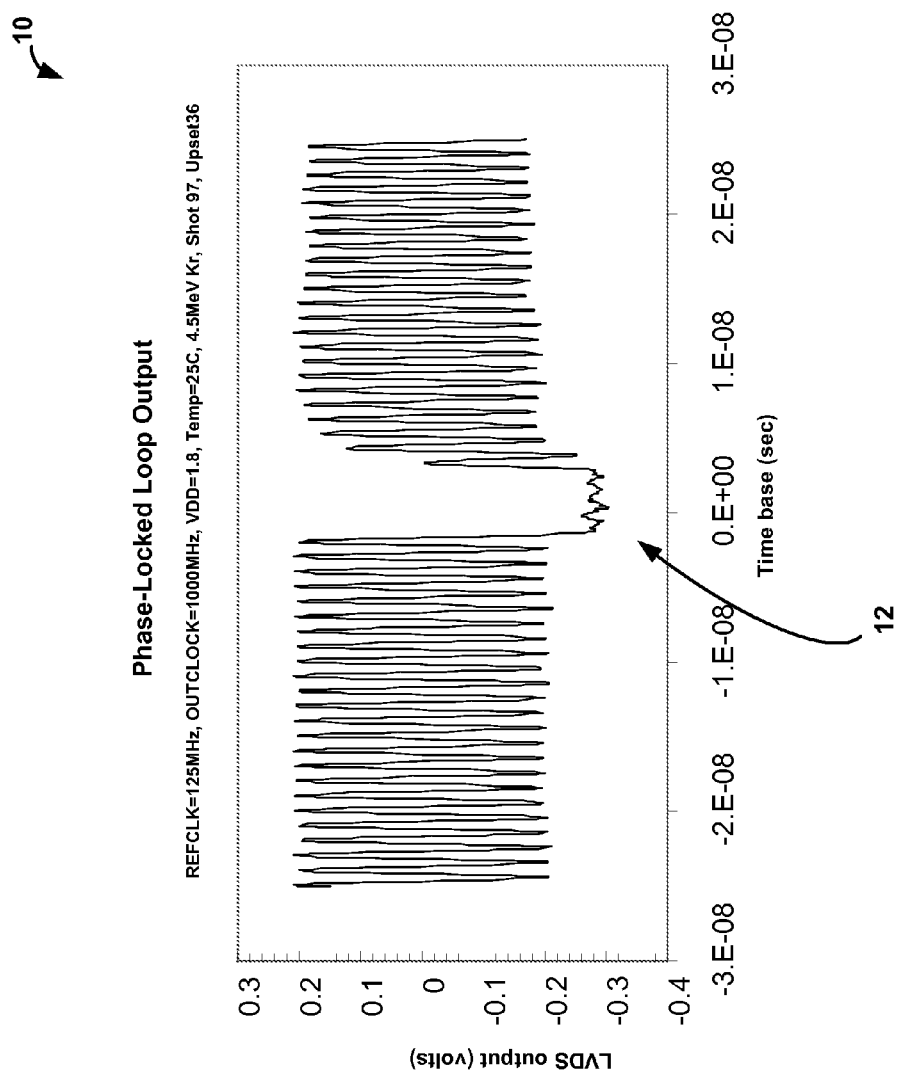
FIG. 1 is a graph illustrating a type of disturbance that might be observed in a phase-locked loop.
Figure 2:
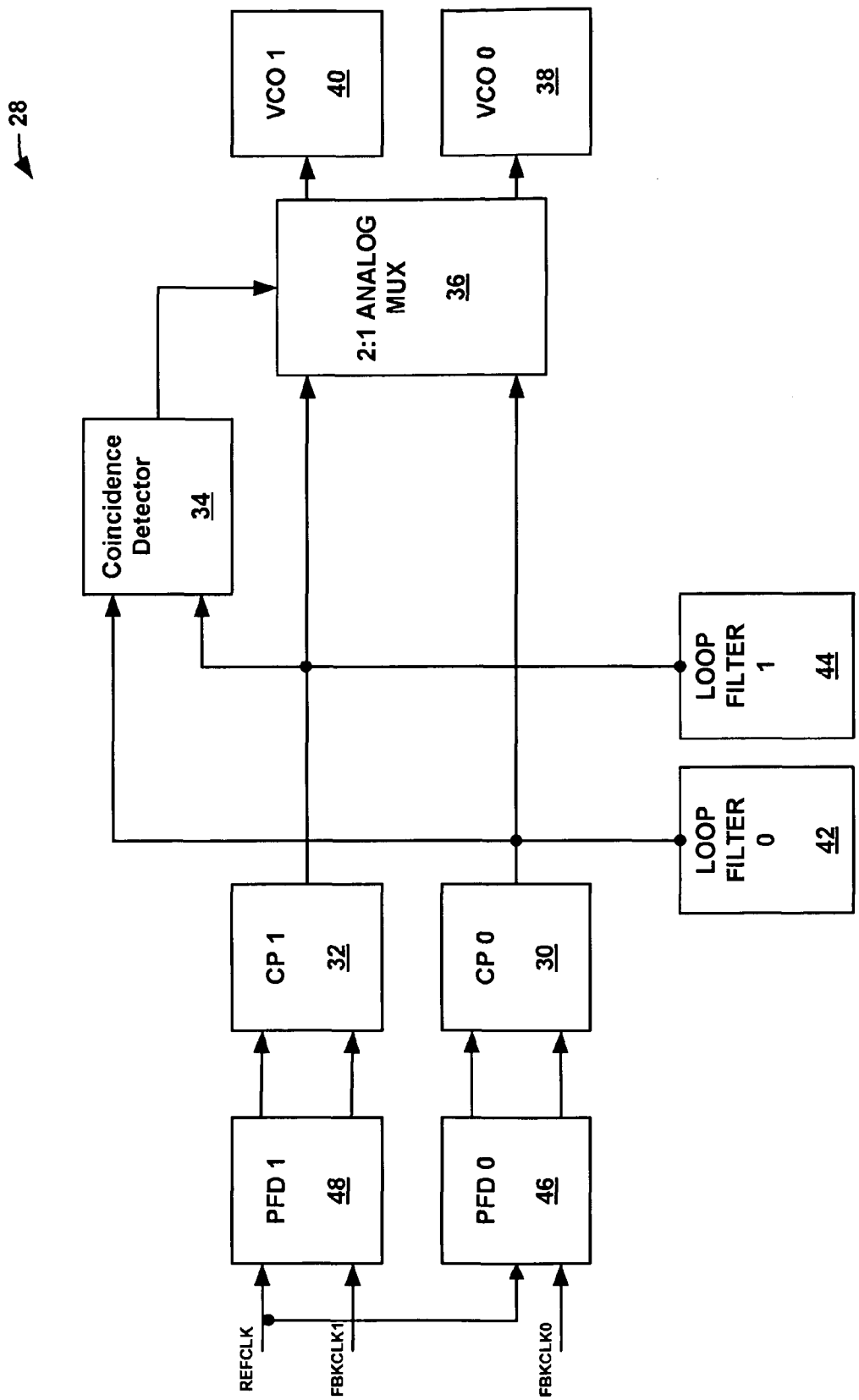
FIG. 2 is a simplified block diagram illustrating a radiation-hardened charge pump topology as implemented in a phase-locked loop circuit, in accordance with a first embodiment of the present invention.

FIG. 2 is a simplified block diagram illustrating a radiation-hardened charge pump topology 28 as implemented in a phase-locked loop (PLL) circuit, in accordance with a first embodiment of the present invention. The topology 28 includes first and second charge pumps 30 and 32 each providing outputs to a coincidence detector 34 and an analog 2:1 multiplexer 36. The coincidence detector 34 is an analog comparator that provides an output to the analog multiplexer 36 that corresponds to whether the outputs of charge pumps 30 and 32 are coincident (i.e. within a defined tolerance of one another). Based on this output from the coincidence detector 34, the analog multiplexer 36 outputs one of two signals to voltage controlled oscillators (VCOs) 38 and 40. These VCOs 38 and 40 serve as outputs (e.g. OUTCLK0 and OUTCLK1) and also provide feedback clock signals (FBKCLK0 and FBKCLK1) to phase frequency detectors (PFDs) 46 and 48, which, along with a reference clock signal REFCLK, are used by the PFDs 46 and 48 to determine whether the clock signals are in phase. Loop filters 42 and 44 for removing noise are connected respectively to the outputs of the first and second charge pumps 30 and 32.

The charge pump topology 28 is designed to be less susceptible to radiation events. For example, if an SEU strike occurs at one of the charge pumps 30 or 32, the charge pump topology 28 is able to detect that SEU strike and disable the connections between the charge pumps 30 and 32 and the loop filters 42 and 44 until the effects of the event have diminished. The coincidence detector 34 determines whether an SEU strike has likely occurred at one of the charge pumps 30 and 32 by comparing the outputs of charge pumps 30 and 32 to determine whether they are in a defined tolerance (coincidence band) of one another. If the outputs of charge pumps 30 and 32 are not within the coincidence band, the coincidence detector flags that occurrence. The charge being sent to the corresponding loop filter is shut off. Each of the loop filters 42 and 44 is capable of sustaining its voltage at least until the SEU event dissipates (on the order of less than a nanosecond) and the outputs of the charge pumps 30 and 32 are once again within the coincidence band. The loop is therefore not unlocked or disrupted and the system continues to operate as if nothing happened. In an alternative embodiment, the voltage of the loop filter could utilize the loop filter voltage to intelligently follow the unaffected charge pump until the SEU strike subsides.

In the preferred embodiment for a PLL application, each charge pump 30 and 32 is implemented as a switched alternating current source of around 3 uA, a capacitor in series with a resistor (e.g. 150 pF capacitor and 20 kΩ resistor), with the combination in parallel with a capacitor (e.g. 0.5 pF).

Implementation in an Alternative Phase-Locked Loop Circuit

Figure 3:
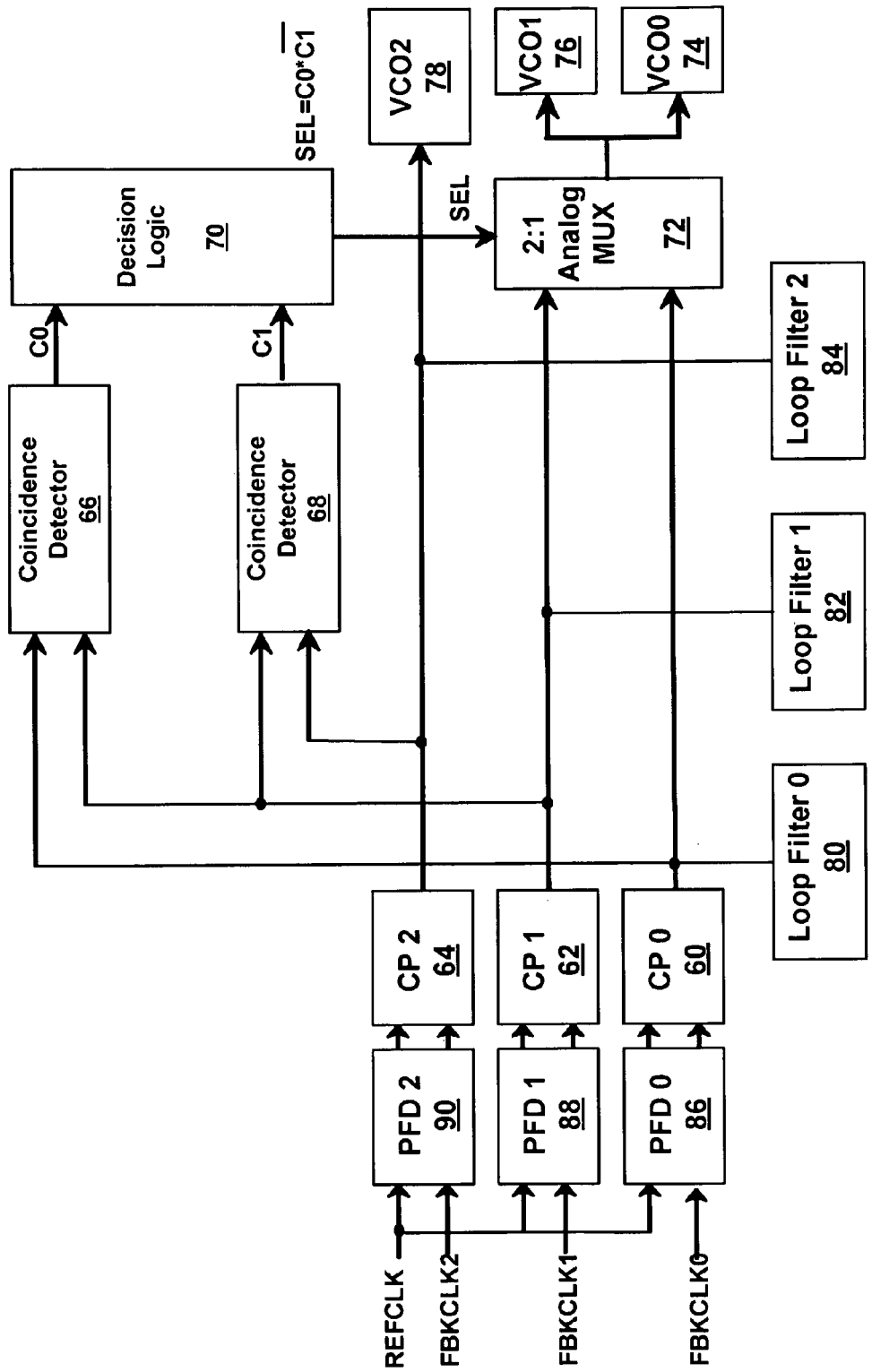
FIG. 3 is a simplified block diagram illustrating a radiation-hardened charge pump topology as implemented in an alternative phase-locked loop circuit, in accordance with a second embodiment of the present invention.

FIG. 3 is a block diagram illustrating a radiation-hardened charge pump topology as implemented in an alternative phase-locked loop circuit, in accordance with a second embodiment of the present invention.

In this alternative radiation-hardened charge pump topology 58, the circuit design includes first 60, second 62, and third 64 charge pumps. The outputs of the charge pumps 60, 62, 64 are connected respectively to first 80, second 82, and third 84 loop filters that serve to reduce noise signal interference. This second embodiment includes a first coincidence detector 66 as well as a second coincidence detector 68 for receiving the outputs from the charge pumps 60, 62, 64. The first coincidence detector 66 is an analog comparator that outputs a high signal when the signal from the first charge pump 60 is in coincidence with the signal from the second charge pump 62. The second coincidence detector 68 is an analog comparator that outputs a high signal when the signal from the second charge pump 62 is in coincidence with the signal from the third charge pump 64. Output signals C0 and C1 from the first and second coincidence detectors 66 and 68 are sent into the decision logic 70, which may be implemented as hardware, software, or a combination of hardware and software. From the decision logic 70, an output signal SEL is sent to an analog 2:1 multiplexor 72. The logic table that determines the signal value for SEL can be found in Table I.

TABLE I

SEL = C0 * $\overline{C1}$

| C0 | C1 | SEL |
|----|----|-----|
| 0  | 0  | 0   |
| 0  | 1  | 0   |
| 1  | 0  | 1   |
| 1  | 1  | 0   |

The analog 2:1 multiplexor 72 receives its two input signals from the output signals of the first charge pump 60 and the second charge pump 62. The analog 2:1 multiplexor 72 uses the SEL signal to select which signal from the two charge pumps 60, 62 will be its output. The output from the analog 2:1 multiplexor 72 will determine the signal value sent to VCOs 74 and 76. Unlike the first and second VCOs 74, 76, the third VCO 78 will always receive its signal from the output of the third charge pump 64. Each of the VCOs 74, 76, 78 provide the respective feedback clock signals FBKCLK0, FBKCLK1, FBKCLK2 to be looped back to the corresponding first 86, second 88, and third 90 PFDs. Each of the feedback clock signals FBKCLK0, FBKCLK1, FBKCLK2 are compared to a reference clock signal REFCLK at the PFDs 86, 88, 90 to determine whether the two clock signals are in phase.

The outputs from the second charge pump 62 and the third charge pump 64 are designed to be used for voting purposes. As seen in Table I above, the SEL signal will select the first charge pump 60 signal as the analog 2:1 multiplexor's output in most situations. The only time the SEL signal selects a different output for the analog 2:1 multiplexor 72 is when an SEU strike occurs at the third charge pump 64. In this scenario, an SEU strike causes a voltage disturbance at the third charge pump 64 and the first coincidence detector 66 will not detect a voltage disturbance while the second coincidence detector 68 will. Only in this scenario will the decision logic 70 set the SEL signal high and cause the analog 2:1 multiplexor 72 to select the second charge pump 62 signal as its output.

The charge pump topology 58 is designed to be less susceptible to radiation events that can cause voltage disturbances from interfering in a loop circuit. The outputs from coincidence detectors 66 and 68 will remain high as long as the inputs from the charge pumps remain in coincidence. However, when a radiation event such as an SEU strike occurs on one of the charge pumps 60, 62, 64 a voltage disturbance is created at that charge pump. The corresponding coincidence detector 66, 68 flags the occurrence of the SEU strike by detecting the charge pump inputs are not in coincidence with each other. When the charge pump topology 58 detects an SEU strike, it disables the connections between the charge pumps 60, 62, 64 and its corresponding loop filter 80, 82, 84.

Each of the loop filters 80, 82, 84 are capable of sustaining its voltage at least until the SEU event dissipates (on the order of less than a nanosecond) and the outputs of the charge pumps 60, 62, 64 are once again within the coincidence band. This way the loop is not unlocked or disrupted by a voltage disturbance being circulated around the circuit and the system continues to operate as if nothing happened. In an alternative embodiment, the voltage of the loop filter could utilize the loop filter voltage to intelligently follow an unaffected charge pump signal until the SEU strike subsides.

In the preferred embodiment for a PLL application, each charge pump 30 and 32 is implemented as a switched alternating current source of around 3 uA, a capacitor in series with a resistor (e.g. 150 pF capacitor and 20 kΩ resistor), with the combination in parallel with a capacitor (e.g. 0.5 pF).

Signal Coincidence Circuit with Adjustable Threshold

Figure 4:
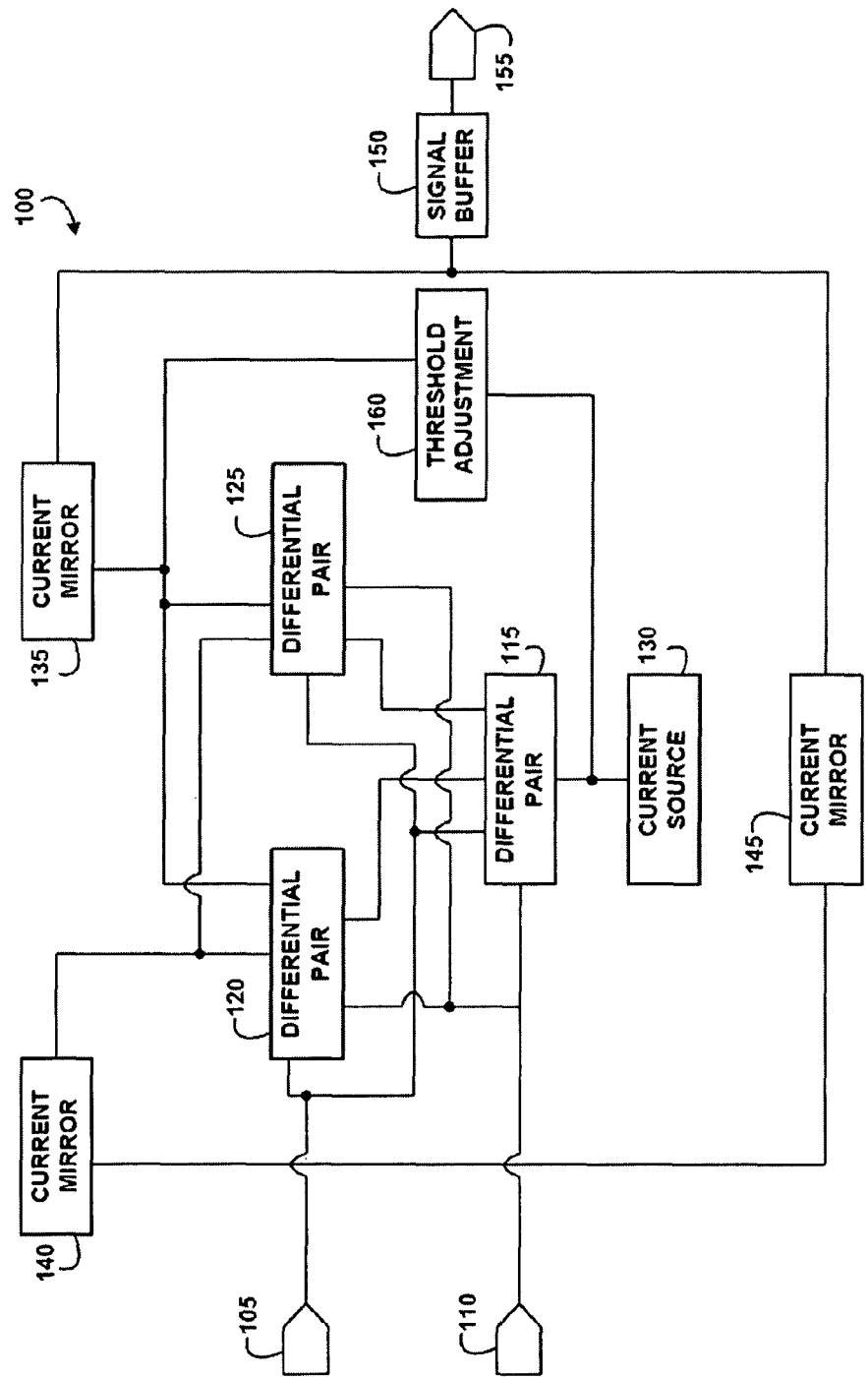
FIG. 4 is a simplified block diagram of a signal coincidence detection circuit with adjustable threshold.

Referring to FIG. 4, a block diagram illustrating an example signal coincidence detection circuit 100 is shown. This circuit is described in further detail in U.S. Pat. No. 7,279,909, assigned to Honeywell International, Inc., and is hereby incorporated by reference herein. The circuit 100 includes a first input signal terminal 105 and a second input signal terminal 110. The input signal terminals 105,110 are coupled with a first differential transistor pair 115, a second differential transistor pair 120 and a third differential transistor pair 125. In operation, the first input signal terminal 105 receives a first input signal and the second input signal terminal 110 receives a second input signal. The signal coincidence detection circuit 100 determines whether or not the first and second input signals are coincident.

To determine whether the first and second input signals are coincident, the first and second input signals are communicated from the input signal terminals 105,110 to the first, second and third differential pairs 115,120,125. In comparing the first and second input signals for coincidence, a first tail current is provided to the first differential pair 115 by a current source 130. The first differential pair 115, in turn, provides a second tail current to the second differential transistor pair 120 (e.g., via a first transistor) and a third tail current to the third differential transistor pair 125 (e.g., via a second transistor). The second and third tail currents are based on the first and second input signals.

The second and third differential pairs 120,125 produce a plurality of currents (from the second and third tail currents) based on the first and second input signals. For the circuit 100, the currents produced by the second and third differential transistor pairs 120,125 are combined to produce two combined currents. To produce the combined currents, respective drain terminals of transistors of the second and third differential transistors pairs 120,125 are coupled to one another.

A first combined current is communicated to a current mirror 135. The current mirror 135 operates as a pull-up device in the circuit 100. A second combined current is communicated to a current mirror 140. The current mirror 140 mirrors the second combined current and communicates that mirrored current to another current mirror 145. The current mirror 145 operates as a pull-down device in the circuit 100. The first and second combined currents are then communicated (via the current mirrors 135,140,145) to a signal buffer 150.

The signal buffer 150 produces a digital signal based on the first and second combined currents, where the digital signal produced by the signal buffer 150 indicates whether the first and second input signals are coincident (e.g., within a band of coincidence). For instance, the signal buffer 150 may generate a logic "1" signal to indicate that the first and second input signals are coincident and generate a logic "0" signal to indicate that the first and second input signals are not coincident. Of course, the opposite may also be the case, where a logic "0" indicates that the input signals are coincident and a logic "1" indicates that the input signals are not coincident. It will be appreciated that, the signal buffer 150 may take any number of forms. For example, the signal buffer 150 may be implemented as an inverter or, alternatively, as a hex buffer. The digital signal produced by the signal buffer 150 may then be communicated to other circuitry via an output signal terminal 155.

The signal coincidence detection circuit 100 further includes a threshold adjustment device 160. The threshold adjustment device 160 is coupled with the second and third differential pairs and the current mirror 135. In the circuit 100, the threshold adjustment device 160 acts as a current "steering" device. Current is "steered" from the current source 115 (via the differential transistor pairs 115,120,125) by applying a threshold voltage to the threshold adjustment device 160.

In such an approach, the threshold adjustment device 160 may take the form of an n-type field effect transistor (FET) that is coupled in parallel with the differential transistor pairs 115,120,125, where a source terminal of the FET is coupled with the current source and a drain terminal of the FET is coupled with the second and third differential pairs and the current mirror 135. Further, the threshold voltage would be applied to a gate terminal of the FET.

In such a circuit, current produced by the current source 130 (and communicated through the differential transistor pairs 115,120,125) would be "steered" through the threshold adjustment device 160 (and away from the current mirror 135) when the first and second input signals have voltage amplitudes that are at or below the threshold voltage applied to the threshold adjustment device 160. However, for input signals that have voltage amplitudes greater than the applied threshold voltage, only a relatively small portion of the current is "steered" through the threshold adjustment device 160. The portion of the current that is not "steered" through the threshold adjustment device 160 is communicated to the current mirror 135 and, in turn, to the signal buffer 150. This current "steering" results in the circuit 100 only indicating the coincidence of the first and second input signals when the voltage amplitude of those input signals exceeds the threshold voltage applied to the threshold adjustment device 160 (e.g., the voltage applied to the gate of the n-type FET used to implement the threshold adjustment device 160).

Figure 5:
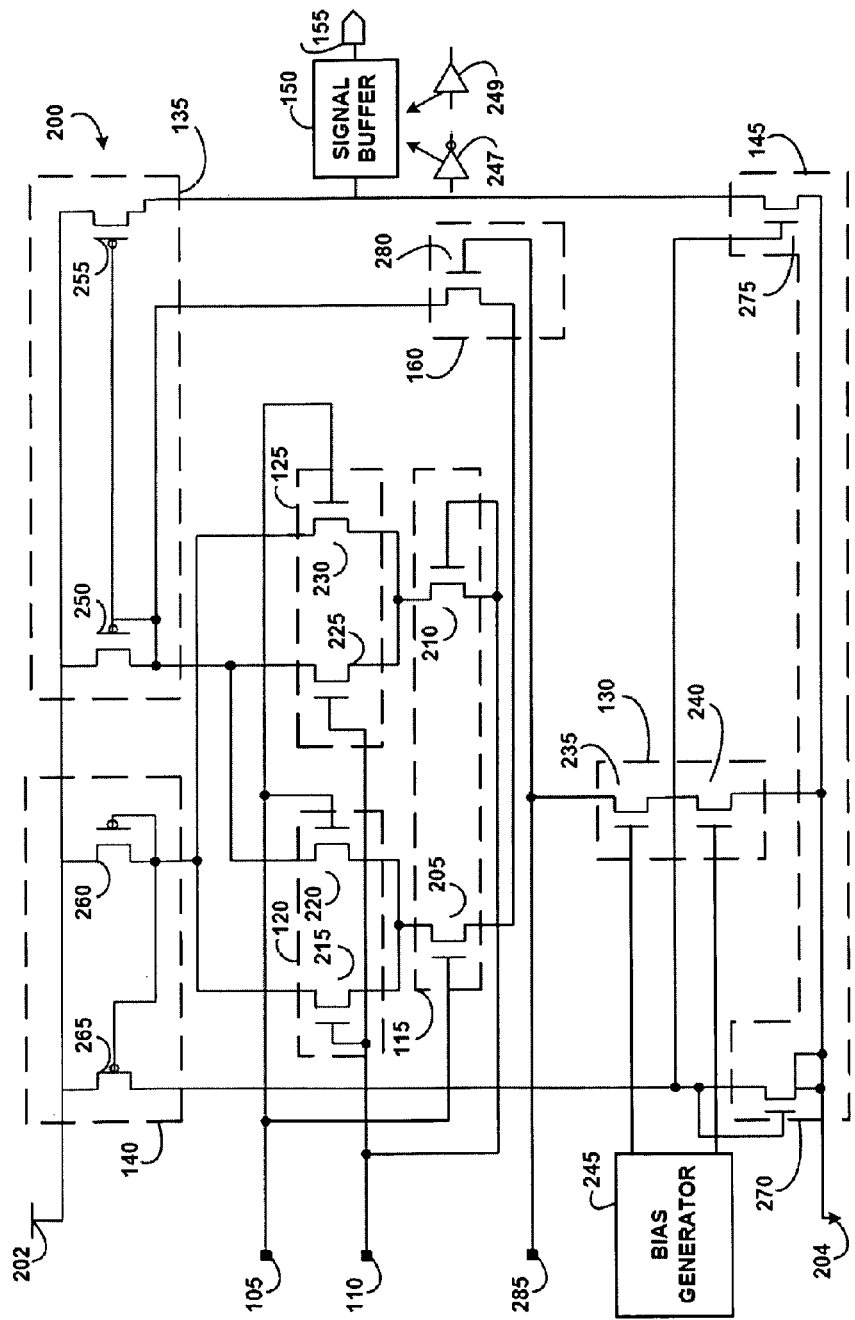
FIG. 5 is a simplified schematic/block diagram illustrating, in further detail, a signal coincidence detection circuit with adjustable threshold.

Referring now to FIG. 5, a schematic diagram illustrating, in more detail, a signal coincidence detection circuit 200 is shown. The circuit 200 includes a power supply terminal 202 that is used communicate an appropriate power supply voltage to the components of the circuit 200. Likewise, the circuit 200 also includes an electrical ground terminal 204 to provide a ground reference to the components of the circuit 200. In the circuit 200, the first differential transistor pair 115 includes a first n-type FET 205 and a second n-type FET 210. The source terminals of the FETs 205,210 are coupled with one another. The second differential pair 120 includes a first n-type FET 215 and a second n-type FET 220, where the source terminals of the FETs 215,220 are coupled with one another. In like fashion, the third differential transistor pair 125 includes a first n-type FET 225 and a second n-type FET 230, where the source terminals of the FETs 225,230 are coupled with one another.

The drain terminal of the FET 205 of the first differential pair 115 is coupled with the source terminals of the FETs 215,220 of the second differential pair 120 and, as noted above, provides a tail current to the second differential pair 120. In similar fashion, the drain terminal of the FET 210 of the first differential pair 115 is coupled with the source terminals of the FETs 225,230 of the third differential pair 125 and provides a tail current to the third differential pair 125.

As shown in FIG. 5, the source terminals of the respective FETs of the differential pairs 115,120,125 are coupled directly to one another. In such an embodiment, the band of coincidence (as was discussed above) for the circuit 200 would be established by adjusting the size of the FETs of the differential pairs 115,120,125. In other embodiments, the coincidence band may also be established using a technique that may be termed resistive degeneration. In such an approach, rather than coupling the source terminals of the respective FETs of each differential pair 115,120,125 directly to each other, resistors are inserted between the source terminals. Such an approach allows for "tuning" of the coincidence band and also increases the linearity of the signal coincidence detection circuit. Resistive degeneration does, however, result in a reduction of the gain of such a signal coincidence detection circuit. Therefore, the particular approach used for establishing a coincidence band will depend on the intended application of a particular signal coincidence detection circuit.

The current source 130 of the circuit 200 includes a first n-type FET 235 and a second n-type FET 240 The FETs 235,240 are coupled in a stacked arrangement with the drain of the FET 235 being coupled with the source terminals of the FETs 205 and 210 of the differential pair 115. The source terminal of the FET 235 is coupled with the drain terminal of the FET 240 and the source terminal of the FET 240 is coupled with the electrical ground reference terminal 204. The gate terminals of the FETs 235,240 of the current source 130 are coupled with a bias generator 245, which provides two direct-current voltage biases to the current source 130. The current source 130 uses these voltage biases to "mirror" current references provided to the bias generator 245. The bias generator 245 may take any number of forms. For instance, the bias generator may be implemented as a cascoded bias generator.

As shown in FIG. 5, and as was described above, the signal buffer 150 may be implemented as an inverter 247. As an alternative, the signal buffer 150 may be implemented as a hex buffer 249. Other possibilities also exist. For instance, the signal buffer 150 may be implemented as a series of inverters or hex buffers. It will be appreciated that such an approach may provide additional noise immunity as compared to the use of a single inverter or hex buffer.

In the circuit 200, drain terminals of the second FET 220 of the second differential pair 120 and the first FET 225 of the third differential pair are coupled with each other. The drain terminals of the FETs 220,225 are further coupled with the current mirror 135, which acts as a pull-up device in the circuit 200. Because the drain terminals of the FETs 220,225 are coupled with each other, the currents produced by the FETs 220,225 are combined and communicated to the current mirror 135 (assuming the threshold adjustment device 160 is off).

The current mirror 135 includes a first p-type FET 250 and a second p-type FET 255. The combined current from the FETs 220,225 is communicated to the FET 250. The combined current is then mirrored by the FET 255 and the mirrored current is communicated to the signal buffer 150.

Also in the circuit 200, drain terminals of the first FET 215 of the second differential pair 120 and the second FET 230 of the third differential pair 125 are coupled with each other such that the FETs 215,230 produce a second combined current. The second combined current is communicated to the current mirror 140. The current mirror 140 includes a first p-type FET 260 and a second p-type FET 265. The second combined current is communicated to the FET 260. The second combined current is then mirrored by the FET 265 and communicated to the current mirror 145, which acts as a pull-down device in the circuit 200.

The current mirror 145 includes a first n-type FET 270 and a second n-type FET 275. The mirrored current from the current mirror 140 is communicated to the transistor 270, which operates as a diode in the circuit 200. The current is then again mirrored by the FET 275 and communicated to the signal buffer 150.

The signal buffer 150 produces a digital signal based on the currents communicated to it by the FETs 255,275. This digital signal indicates whether or not the first and second input signals applied to the input signal terminals 105,110 of the circuit 200 are coincident. If the signal buffer 150 in the circuit 200 is implemented as an inverter, the digital signal produced by the circuit 200 will be a logic "1" when the first and second input signals are coincident, while the digital signal will be a logic "0" when the input signals are not coincident.

As shown in FIG. 5, the threshold adjustment device 160 is implemented as an n-type FET 280, which acts as a current steering device when establishing a threshold voltage for the circuit 200. The threshold voltage is applied to a gate terminal of the FET 280 via a threshold voltage input terminal 285. When a threshold voltage other than 0 V is applied to the threshold voltage input terminal 285, the combined current produced by the FETs 235,240 is "steered" through the FET 280 when the amplitude of the input signals applied to the input signal terminals 105,110 is at or below the threshold voltage, as was discussed above. As was also discussed above, when the amplitude of the input signals is greater than the threshold voltage, only a relatively small portion of the combined current of the FETs 235,240 is "steered" through the FET 280. The remaining portion is communicated to the signal buffer 150 via the current mirror 135 and used to produce the digital signal to indicate the coincidence of the first and second input signals.

Conclusion

While the charge pump topologies described above were in the context of a phase-locked loop example, the topologies could also be utilized in other circuits that use charge pumps for applications that are susceptible to SEUs. For example, the charge pump topologies could also be used in delay-locked loops (DLL), voltage regulators, and other applications that otherwise might be disrupted by SEUs.

Various arrangements and embodiments in accordance with the present invention have been described herein. It will be appreciated, however, that those skilled in the art will understand that changes and modifications may be made to these arrangements and embodiments as well as combination of the various embodiments without departing from the true scope and spirit of the invention, which is defined by the following claims.

We claim:

1. A radiation-hardened charge pump circuit, comprising:
   a first charge pump that includes a first charge pump output;
   a second charge pump that includes a second charge pump output;
   a first coincidence detector that receives as inputs the first charge pump output and the second charge pump output and produces as an output a first coincidence signal based on comparing the first charge pump output to the second charge pump output to determine whether the first and second charge pump outputs are in a defined coincidence band of one another, wherein the first coincidence signal indicates whether a single event upset (SEU) has occurred at one or more of the first charge pump and the second charge pump;
   an analog 2:1 multiplexor for selecting either the first charge pump output or the second charge pump output based on the first coincidence signal; and
   a third charge pump that includes a third charge pump output;
   a second coincidence detector that receives as inputs the second charge pump output and the third charge pump output and produces as an output a second coincidence signal; and
   decision logic that receives as inputs the first coincidence signal and the second coincidence signal and produces as an output a select signal based on the first coincidence signal and the second coincidence signal, wherein the analog 2:1 multiplexor selects either the first charge pump output or the second charge pump output based on the select signal.

2. The circuit of claim 1, wherein the first coincidence signal is at logic "high" if the first charge pump output and the second charge pump output are within a defined tolerance of one another, and wherein the first coincidence signal is at logic "low" if the first charge pump output and the second charge pump output are not within the defined tolerance of one another.

3. The circuit of claim 1, wherein the first and second coincidence detectors are analog comparators, wherein the first coincidence signal indicates whether the first charge pump output and the second charge pump output are within a defined tolerance of one another, and wherein the second coincidence signal indicates whether the second charge pump output and the third charge pump output are within the defined tolerance of one another.

4. The circuit of claim 3, wherein the first coincidence signal is at logic "high" if the first charge pump output and the second charge pump output are within the defined tolerance of one another, wherein the second coincidence signal is at logic "high" if the second charge pump output and the third charge pump output are within the defined tolerance of one another, wherein the first coincidence signal is at logic "low" if the first charge pump output and the second charge pump output are not within the defined tolerance of one another, and wherein the second coincidence signal is at logic "low" if the second charge pump output and the third charge pump output are not within the defined tolerance of one another.

5. The circuit of claim 4, wherein the decision logic produced a logic "high" select signal only if the first coincidence signal is logic "high" and the second coincidence signal is logic "low".

6. The circuit of claim 1, further comprising:
   a first voltage controlled oscillator that produces a first feedback clock signal;
   a second voltage controlled oscillator that produces a second feedback clock signal;
   a first phase frequency detector that receives as inputs a reference clock signal and the first feedback clock signal and produces an output to the first charge pump;
   a second phase frequency detector that receives as inputs the reference clock signal and the second feedback clock signal and produces an output to the second charge pump;
   a first loop filter that filters the first charge pump output; and a second loop filter that filters the second charge pump output, thereby resulting in a radiation-hardened phase-locked loop.

7. The circuit of claim 1, further comprising:
a first voltage controlled oscillator that produces a first feedback clock signal;
a second voltage controlled oscillator that produces a second feedback clock signal;
a third voltage controlled oscillator that procures a third feedback clock signal;
a first phase frequency detector that receives as inputs a reference clock signal and the first feedback clock signal and produces an output to the first charge pump;
a second phase frequency detector that receives as inputs the reference clock signal and the second feedback clock signal and produces an output to the second charge pump; and
a third loop filter that filters the third charge pump output, thereby resulting in a radiation-hardened phase-locked loop.

8. A phase-locked loop incorporating the circuit of claim 1.
9. A delay-locked loop incorporating the circuit of claim 1.
10. A voltage regulator incorporating the circuit of claim 1.
11. A radiation-hardened phase-locked loop, comprising:
a first charge pump that includes a first charge pump output;
a second charge pump that includes a second charge pump output;
a third charge pump that includes a third charge pump output;
a first coincidence detector that receives as inputs the first charge pump output and the second charge pump output and produces as an output a first coincidence signal, wherein the first coincidence signal is at logic "high" if the first charge pump output and the second charge pump output are within a defined tolerance of one another, and wherein the first coincidence signal is at logic "low" if the first charge pump output and the second charge pump output are not within the defined tolerance of one another;
a second coincidence detector that receives as inputs the second charge pump output and the third charge pump output and produces as an output a second coincidence signal, wherein the second coincidence signal is at logic "high" if the second charge pump output and the third charge pump output are within the defined tolerance of one another, and wherein the second coincidence signal is at logic "low" if the second charge pump output and the third charge pump output are not within the defined tolerance of one another;
decision logic that receives as inputs the first coincidence signal and the second coincidence signal and produces as an output a select signal based on the first coincidence signal and the second coincidence signal, wherein the decision logic produces a logic "high" select signal if the first coincidence signal is logic "high" and the second coincidence signal is logic "low", and wherein the decision logic produces a logic "low" select signal if the first coincidence signal is logic "low" or if both the first and second coincidence signals are logic "high";
an analog 2:1 multiplexor that selects the second charge pump output if the select signal is logic "high" and selects the first charge pump output if the select signal is logic "low";
a first voltage controlled oscillator that produces a first feedback clock signal;
a second voltage controlled oscillator that produces a second feedback clock signal;
a third voltage controlled oscillator that produces a third feedback clock signal;
a first phase frequency detector that receives as inputs a reference clock signal and the first feedback clock signal and produces an output to the first charge pump;
a second phase frequency detector that receives as inputs the reference clock signal and the second feedback clock signal and produces an output to the second charge pump;
a third phase frequency detector that receives as inputs the reference clock signal and the third feedback clock signal and produces an output to the third charge pump;
a first loop filter that filters the first charge pump output;
a second loop filter that filters the second charge pump output; and
a third loop filter that filters the third charge pump output.

12. A method for radiation-hardening a charge-pump circuit, comprising:
comparing, using an analog comparator, a first analog charge pump signal from a first charge pump to a second analog charge pump signal from a second charge pump to determine whether the first analog charge pump signal and the second analog charge pump signal are in a defined coincidence band of one another, wherein comparing the first analog charge pump signal from the first charge pump to the second analog charge pump signal from the second charge pump includes comparing to determine whether a single event upset (SEU) has occurred at one or more of the first charge pump and the second charge pump;
selecting either the first analog charge pump signal or the second analog charge pump signal based on the determination;
outputting the selected charge pump signal;
comparing the second analog charge pump signal to a third charge pump signal from a third charge pump; and
applying logic to the first comparison and the second comparison to determine whether the first analog charge pump signal or the second analog charge pump signal is selected.

* * * * *